United States Patent [19]

Wininger

[11] 4,158,356
[45] Jun. 19, 1979

[54] SELF-POWERED TRACKING SOLAR COLLECTOR

[76] Inventor: David V. Wininger, P. O. Box 337 606 Bjornsen, Big Rapids, Mich. 49307

[21] Appl. No.: 770,674

[22] Filed: Feb. 22, 1977

[51] Int. Cl.$^2$ ................................................. F24J 3/02
[52] U.S. Cl. ..................................... 126/271; 126/270; 136/89 PC
[58] Field of Search .................... 126/270, 271; 108/6, 108/7, 8; 250/203 R; 350/3, 99, 104, 289, 290, 312

[56] References Cited

U.S. PATENT DOCUMENTS

| | | | |
|---|---|---|---|
| 1,661,473 | 3/1928 | Goddard et al. | 126/271 |
| 1,704,173 | 3/1929 | Chesney | 126/271 |
| 3,348,374 | 10/1967 | Schalkowsky | 60/641 |
| 3,988,166 | 10/1976 | Beam | 126/270 |
| 4,022,185 | 5/1977 | von Hartitzsch | 126/271 |
| 4,038,972 | 8/1977 | Orrison | 126/271 |
| 4,063,543 | 12/1977 | Hedger | 126/270 |
| 4,069,812 | 1/1978 | O'Neill | 126/270 |
| 4,089,323 | 5/1978 | Trihey | 126/270 |

OTHER PUBLICATIONS

"Concentrating Collectors for Solar Heating and Cooling", *Popular Science*, Sep. 1, 1976 (p. 96).

*Primary Examiner*—Carroll B. Dority, Jr.
*Assistant Examiner*—Larry Jones
*Attorney, Agent, or Firm*—Eugene F. Friedman

[57] ABSTRACT

A solar collector tracking the sun through changes in the relative position between the sun and the earth. The collector may rotate about a single axis to follow the sun throughout the day. A second optional axis may compensate for the orientations of the sun in different seasons of the year. The energy received by the collector provides the motive power to effect its positional changes. A reflective concave surface with cylinderal symmetry and a cross-sectional parabolic configuration provides concentrate solar radiation at a transducer. Furnaces with an expandable fluid on either side of the focal line of the parabola connect to pistons to orient the collector. The parabola subtends an arc of about 41° on either side of its center and, for an overall width of w, represents the locus of points equidistant between a straight line and a circle, tangent to the line, of radius $r = kw/2$. The constant k has a value dependent upon the intended latitude of the collector; varies between 0.611 and 0.825; and approximates 0.7425 for 44° of latitude. The axis of rotation passes through the collector's center of area to minimize wind effects.

16 Claims, 12 Drawing Figures

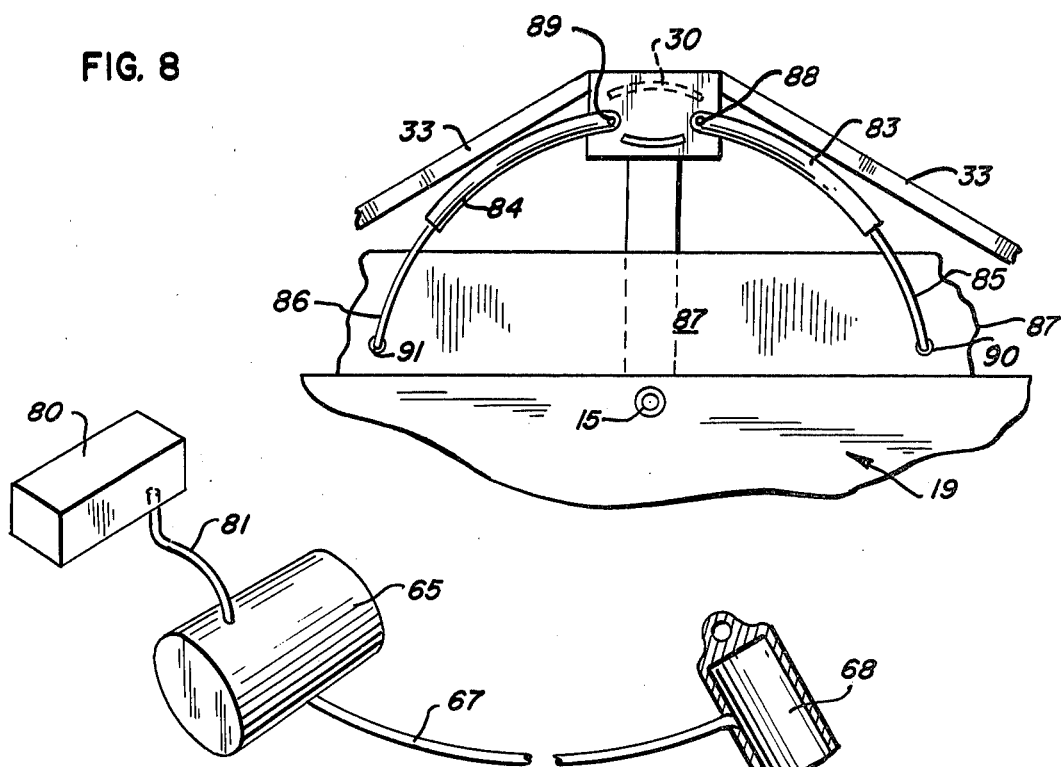
FIG. 8
FIG. 7
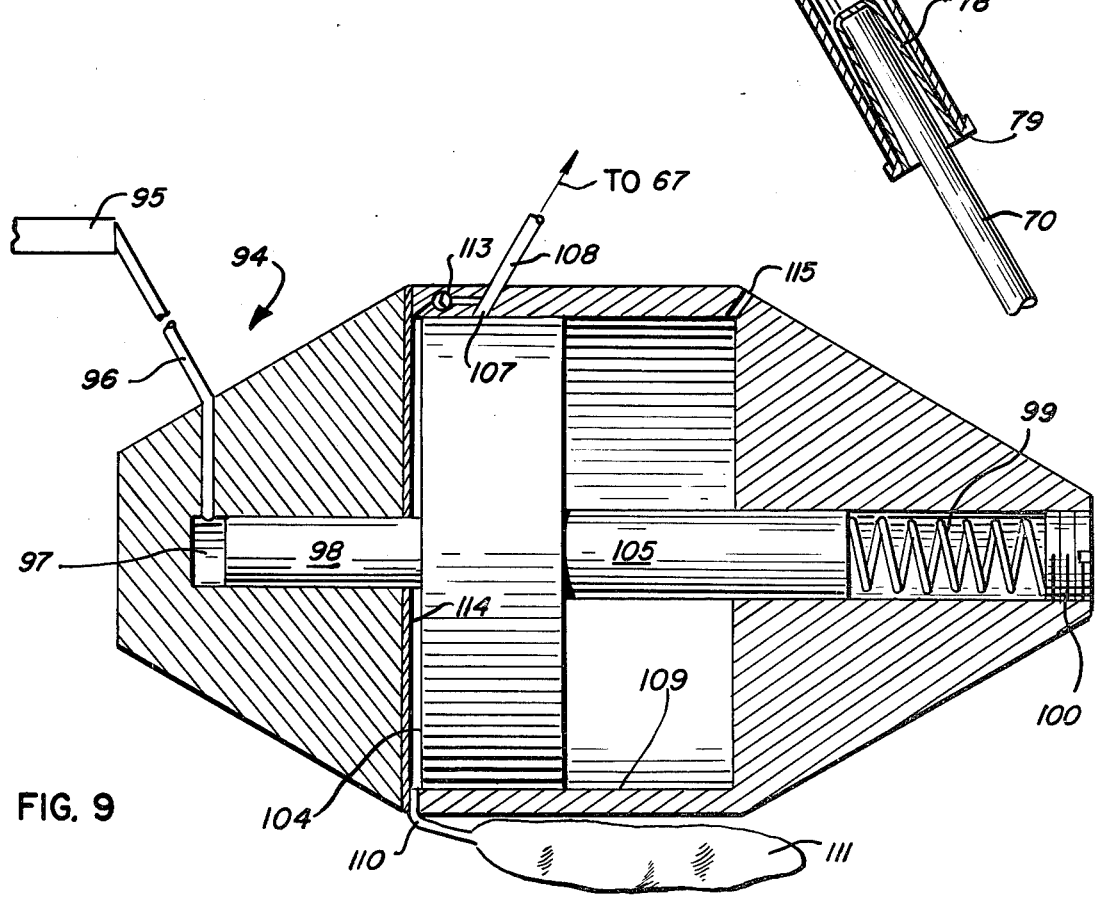
FIG. 9

SELF-POWERED TRACKING SOLAR COLLECTOR

BACKGROUND

Solar energy has received recent interest as an alternative to fossil fuels. Nonetheless, the design of collectors converting such energy to a useful form has created a controversey not yet resolved.

One type of solar collector covers an area, such as the roof of a building, with appropriate transducers. The rays striking these transducers undergo conversion into heated fluids or electricity as appropriate.

However, the elements effecting the conversion of solar energy can efficiently utilize vastly greater amounts of light than that ever received directly from the sun. Moreover, these elements represent relatively expensive items in the system. Consequently, their use for only that radiation naturally incident upon their surfaces appreciably increases the cost and lowers the desirability and utilization of such collectors.

Thus, to improve the economics of the collectors, many designers have increased the concentration of radiation striking the transducing elements. Generally, they employ a focussing device which the rays strike prior to impinging upon the transducers. These inexpensive focusers amass the radiation striking their large surfaces and concentrate them to the appreciably smaller surface areas of the transducers. Thus, a relatively minor additional expense allows the transducers to produce a several-fold greater amount of useful energy.

However, the use of focussing elements requires a precise spatial orientation between the sun, the transducers and the element themselves. Relatively minor displacements from the required alignment produce precipitous declines in the system's efficiency. Moreover, as the earth rotates on its axis, the alignment between the various components will necessarily undergo these misalignments. In addition, the focussing elements that concentrate the solar rays with greatest efficiency suffer the greatest defocussing.

To allow use of focusers throughout the day, various manufacturers have incorporated tracking devices into their systems. These have generally taken the form of electric motors coupled to sensing devices. The motors move the focussing elements and transducers to a position where the sensing devices detect a maximum of solar energy in the region of the latter.

These systems, however, suffer drawbacks seriously limiting their desirability. The inclusion of a sensor, motor, and intermediate couplings significantly increases the cost of the system. Moreover, it requires a source of electricity plus the expenditure for its use.

Moreover, a heavily overcast day may cause the sensor-motor combination to gyrate uncontrollably while seeking the sun's rays. High winds may exceed the corrective capacity of the motor and simply blow the collector away from the requisite orientation.

More recent devices have compromised between the moving-focussing and the stationary-cell systems. These newer devices use stationary focussing elements. Their overall configuration, however, achieves some focussing throughout the day. Consequently, the devices produce better results than the stationary nonfocussing systems consisting of solar-cell arrays. Yet, their efficiencies never approach those of the sun-tracking collectors.

SUMMARY

Deriving the power for a tracking solar collector from the sun's rays obviates the motor with its separate power requirements and fallibilities. Properly constructing the apparatus achieves greater collecting efficiencies and less susceptibility to external mechanical stresses.

A tracking collector includes first a focussing device which gathers the solar radiation striking one area and concentrates it for further use at a separate area. In this latter region, a transducer receives the solar radiation and converts it to a form usable away from the collector.

A structural support holds the focussing and the transducing devices at the desired orientations relative to the earth. It also allows a change in such orientations in order to permit the following of the sun.

To increase the radiation the transducer receives, the collector includes an orienting device to move at least the focuser or the transducer. This device first has collector means which couples to one of these two components. When the transducer receives substantially less radiation than available to it at any particular time, the collector means receives at least some of the radiation striking the focuser.

A converter coupled to the structural support also forms a part of the orienting device. Connected also to either the focuser or the transducer, it changes the orientation of at least one of these components in a direction to increase the amount of radiation striking the latter. It receives the energy for this from the solar radiation received by the collector means.

Typically, the focussing device takes the form of a concave reflective surface. Further, the focuser and the transducer bear a constant relationship to each other and move as a unit to follow the sun.

As a separate facet, the reflective surface may display cylindrical symmetry. On a cross section taken perpendicular to the axis of cylinderal symmetry, the same surface has the shape of a parabola. This geometry achieves the greatest concentration of solar rays at the focal point of the parabola. There, accordingly, appears the transducer.

On the same cross section, w may represent the overall width of the reflective surface. The parabola of ideal configuration derives from a locus of points equidistant between a straight line and a circle tangent to that line and with a radius $r = kw/2$, where k, a constant, depends upon the intended latitude of the apparatus. The magnitude of k varies about from 0.611 to 0.825 and settles at around 0.7425 for approximately 44° of latitude.

As discussed above, the transducer converts solar radiation to a form useful elsewhere. As a result, the energy may move to another location for use at that place.

Should the transducer fail to operate properly, it may collect sufficient energy to become damaged or dangerous. Consequently, the system may include a safety device to prevent these deleterious results. This safety device operates when the transducer's temperature exceeds a predetermined level and prevents the orienting means from placing the focuser and the transducer in the orientation where the latter receives the maximum available solar radiation. The safety may simply prevent the orienting means from changing the position of the transducer or the focuser. Or, it may move the transducer relative to the focuser and out of the position of maximum concentration of solar radiation.

The system may also include a stripping device coupled to either the focuser or the transducer. The device separates the IR. components of the solar radiation from the UV. and Vis. components. The former may then directly provide heat, while the latter represents a good source of energy for electricity.

BRIEF DESCRIPTION OF THE FIGURES

FIG. 7 displays the orienting device utilizing captured solar radiation to properly position the collector apparatus.

FIG. 8 has, for the orienting device, a curved piston requiring no moving connections with the remainder of the apparatus.

FIG. 9 displays one type of safety device for preventing the overheating of the apparatus when the transducer fails to remove the captured energy.

DETAILED DESCRIPTION

Figure 1:
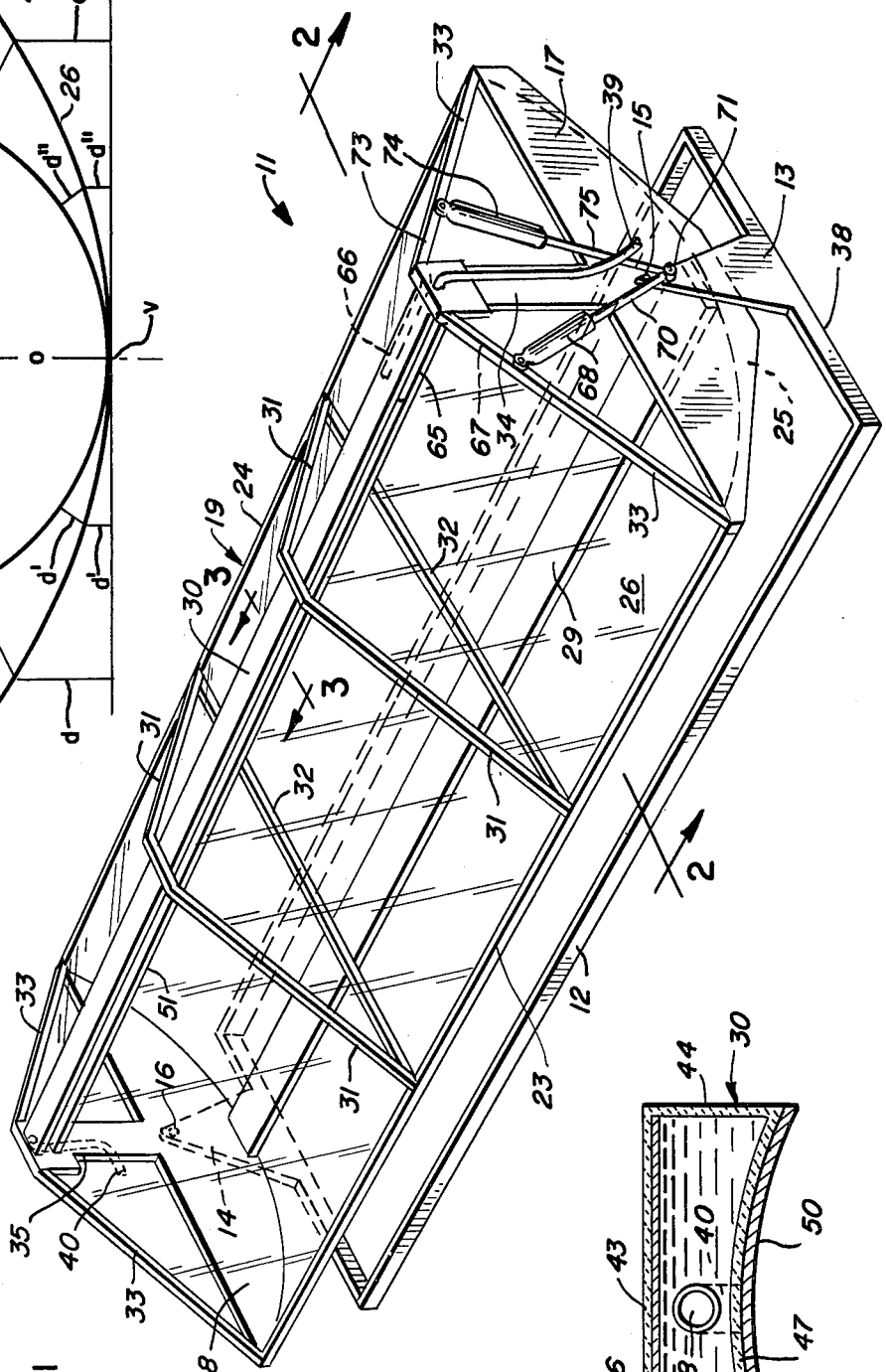
FIG. 1 gives a perspective view of a solar collector utilizing the solar energy it receives to track the sun.
Figure 2:
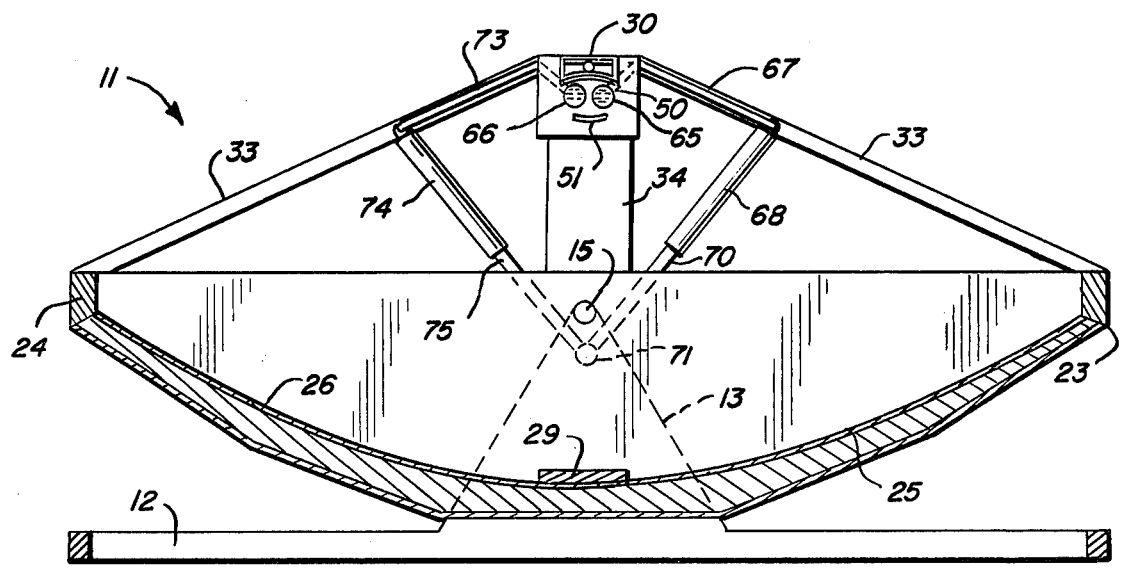
FIG. 2 gives a cross-sectional view of the collector of FIG. 1 along the line 2—2.

The solar collector, shown generally at 11 in FIGS. 1 and 2, includes the base 12 with the two upright supports 13 and 14 at its ends. The supports 13 and 14 have the pivot points 15 and 16, respectively, to which the end plates 17 and 18 of the collector frame, shown generally at 19, pivotally attach. The attachment of the frame 19 at the pivot points 15 and 16 allow the frames to rotate about the axis passing through these two points. This rotation, in turn, permits the essential tracking of the sun.

The end plates 17 and 18 of the frame 19 attach to the side rails 23 and 24, which extend between them. The plates 17 and 18 also connect to the bottom supporting layer 25. This bottom supporting sheet 25 extends from the end plate 17 to the other plate 18 and from the side rail 23 to the other side rail 24. On top of the bottom sheet 25 sits the concave mirrored, reflective surface 26. As discussed below, the surface 26 concentrates the sunlight for use elsewhere.

Moreover, an array 29 of solar cells sits directly on top and in the middle of the bottom sheet 25. After the concentration of the solar radiation and the stripping away of the infrared (IR.) radiation, the ultraviolet and visible (UV. and Vis.) components return to the cell array 29 which converts them to electricity.

At a height above the reflective surface 26, the IR. transducer 30 remains suspended. To hold the IR. transducer 30 in place, the inner beams 31 rigidly extend between it and the side rails 23 and 24. The two cross beams 32 extend directly between the two side rails 23 and 24; connect to them at the same location as do the inner beams 31; and lend structural support to the collector frame 19.

The end beams 33 connect the ends of the IR. transducer 30 with both the end plates 17 and 18 and the side rails 23 and 24. For additional support, the slats 34 and 35 connect directly between the IR. transducer 30 and the middles of the end plates 17 and 18, respectively.

Electrical leads transport the electrical power generated by the array of solar cells 29. The conduit 39 introduces a relatively cool fluid into the IR. transducer 30. The heat provided from the IR. component of the sun's radiation then raises the temperature of the fluid. The conduit 40 transports the heated fluid for use at a remote location.

Figure 3:
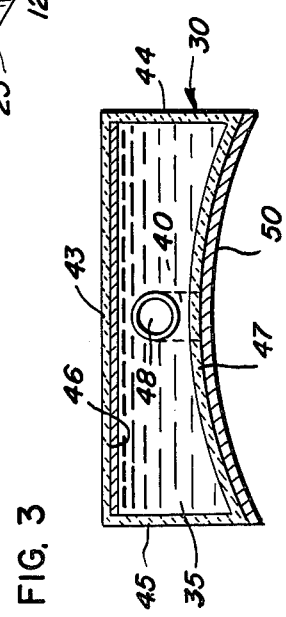
FIG. 3 depicts a stripping device that separates the IR. from the UV. and Vis. components of the solar radiation and captures the former.

The IR. transducer 30, as appears more clearly in FIG. 3, itself forms a conduit for the fluid it heats. The top 43 and the sides 44 and 45 have a heat-impenetrable composition to retain the energy received by the transducer 30. The top 43 also has a silvered coating 46 to return to the fluid rays having passed through it. This helps assure the absorption of substantially all the energy in the radiation. The bottom surface 47 remains transparent to the IR. radiation to allow its entrance into the transducer. The end slat 35 helps retain the fluid within the transducer 30. It also has the opening 48 leading to the conduit 40 provided for the fluid's egress.

The transducer 30 also serves to cast the UV.-Vis. solar radiation components upon the solar cells 29. To accomplish this function, the transducer includes, on its curved bottom surface 46, a dichroic pellical outer coating 50. While leaving the IR. radiation substantially undisturbed, the dichroic coating 50 acts as a reflector for the UV.-Vis. radiation. Thus, the UV.-Vis. components focussed by the reflector 26, strikes the dichroic surface 50 and returns to the solar cells 29. The condenser lens 51, when included, helps achieve the desired focussings.

Figure 4:
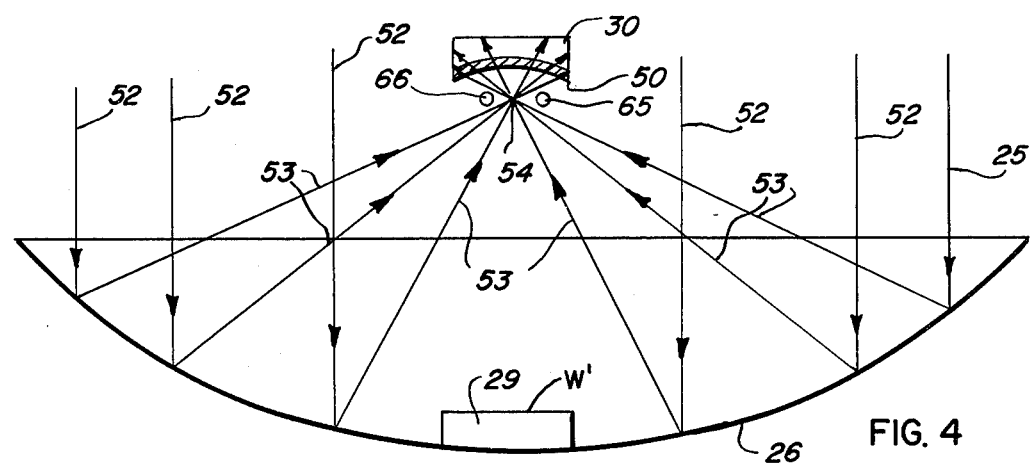
FIGS. 4 and 5, respectively, show the path followed by the IR. and the UV.-Vis. components of the radiation.
Figure 5:
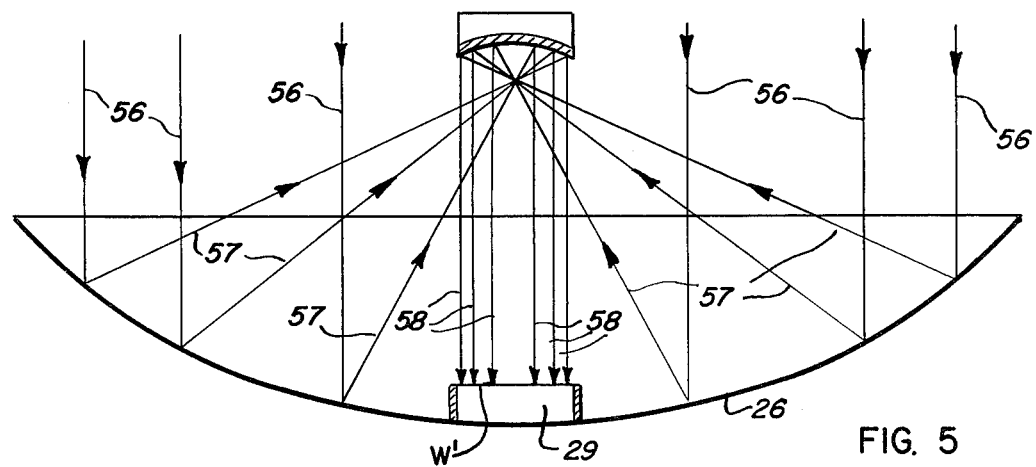

FIGS. 4 and 5 show, respectively, the paths taken by the IR. and the UV.-Vis. components of the solar radiation. As illustrated in the former, the IR. rays 52, when they reach the earth, all follow parallel paths. They first strike the concave surface 26. When the surface 26 has a parabolic shape, as shown. The reflected rays 53 converge to the single point 54, labelled the focal point. After converging to the focal point 54, the reflected rays 53 diverge, but only slightly since they immediately strike the transducer 30. There, they pass through the dichroic coating 50 and into the fluid inside.

The incident UV.-Vis. ray 56 again follow parallel paths near the earth, as shown in FIG. 5. The reflected rays 57 similarly converge to the parabolic surface's 26 focal point 54. They then diverge and strike the dichroic surface 50. The surface 50, however, reflects the UV.-Vis. rays 57. The dichroic surface 50 may itself describe a parabola also having its focus at the point 54.

The UV.-Vis. rays 57 reflected from the parabolic dichroic surface 50 all derive from the focal point 54. Accordingly, they follow parallel paths after departing the surface 50 and until reaching the solar-cell aray 29, which converts them to electricity.

Figure 6:
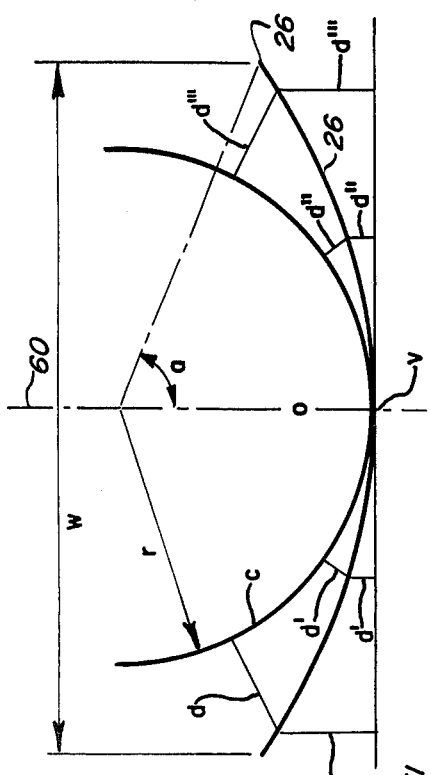
FIG. 6 gives the geometry of the collector's reflective surface used to concentrate the radiation.

FIG. 6 illustrates the geometric considerations utilized in arriving at an efficient configuration for the collector, especially the reflector 26. Initially, the reflector 26, in the cross-sectional views of FIGS. 2 and 6, has a parabolic shape. As alluded to above, this geometry displays the property of focussing the incident parallel rays of the sun to the single focal point 54. This geometry, however, to focus properly, requires a tracking system; if the paths of the sun's rays do not lie parallel to the line 60, known as the "axis" of the parabola, serious defocussing occurs. The line, or axis 60, also represents an axis or plane of bilateral symmetry of the parabola.

An initial decision in constructing the surface 26 concerns its overall width w. This simply depends upon the available space for the apparatus and the strengths of the materials utilized. Moreover, rather than constructing a single collector with a large width w, several smaller parabolae with limited tracking mechanisms may impose less stress on their structural components, while achieving a similar total energy-collecting efficiency.

By definition, a parabola generally represents the locus of points equidistant between a point, its focus; and a line not passing through that point. That latter line is labelled the directrix. Equivalently, as seen in FIG. 6, the same parabola represents the locus of points equidistant between, first, a circle c of radius r, where r represents one-half the distance between the focus 54 and the directrix, and, second, a line 61 tangent to the circle and perpendicular to the axis 60. The distances d, d', d'', and d''' exhibit this relationship. The line 61 lies parallel to the directrix, not shown in FIG. 6, and at one-half the distance from the focus 54. The point v where the line 61, the parabola 26, and the circle 26 meet and where the axis 60 intersects all three is called the vertex of the parabola.

As a result of the above, choosing a radius r for the circle c will serve to determine the shape of the parabolic reflector surface 26. This relates to the desired width w by the equation $$r = kw/2 \qquad (1)$$

The constant k has a value dependent upon the latitude of the intended use of the collector. Generally, it stays within the range of about 0.611 to 0.825. The value of k approximates 0.7425 for 44° of latitude, which falls across the center of Michigan's lower peninsula.

Furthermore, the angle a in FIG. 6 represents the arc subtended by the parabola from the axis 60 to its edge 62. When the angle a exceeds 41°, the costs of construction increase rapidly while the collector efficiency decreases, as discovered emperically. Accordingly, where feasible, the construction of the surface 26 should produce an angle a of about 41°.

The collector of FIG. 1 displays cylindrical symmetry, with an axis of such symmetry lying parallel to the IR. and UV.-Vis. transducers 30 and 29, respectively. In this cylinderal symmetry, the focal point 54 becomes a focal line. As seen in FIGS. 2, 4, and 5, a cross-sectional plane taken perpendicular to the axis of symmetry reveals the geometry of FIG. 6.

Furthermore, the geometry of FIG. 6 allows a more precise statement of the most efficient configurations for dichroic surface 50 of the IR. transducer 30. Where the solar cell array 29 has a total width of w', viewed in FIGS. 4 and 5, for example, then the parabolic dichroic surface 58 is the locus of points equidistant between a circle of radius r' and a straight line drawn tangent to this circle and perpendicular to the line extending between the focus 54 and the center of the solar array 29.

The circle mentioned above has its center at the focus 54 and the radius r' derives from the formula $$r' = kw'/2 \qquad (2)$$

The constant k in equation (2) has the same value as in the equation (1) for the radius r giving rise to the parabolic reflector surface 26.

A second configuration of the solar collector would place the IR. transducer between the reflective surface 26 and its focal point 54. The dichroic coating on the IR. transducer would again describe a parabola having the same focal point 54 as the surface 26. However, the dichroic surface becomes convex, instead of concave as for the IR. transducer 30 in the figures. For the same reflector 26 as above, the convex dichroic surface would still satisfy equation (2) above.

A further possible construction would place the solar cells behind the IR. transducer 30. Accordingly, the light from the reflector 26 would travel to the IR. transducer 30 which removes its heat content. The UV.-Vis. radiation could then pass to the solar cells. This construction eliminates the need for the dichroic and silvered surfaces associated with the transducer 30. Moreover, a fluid with a high refractive index, such as carbon disulfide, would replace the otherwise opaque fluid inside the transducer 30.

Where the incident sunlight travels along paths parallel to the axis 60, seen in FIG. 6, of the parabolic surface 26, the rays, after striking the surface 26 will all converge to the focal point 54. This represents the situation for the IR. rays in FIG. 4 and the UV.-Vis. rays in FIG. 5.

However, the light approaching the reflector 26 along paths out parallel to the axis 60 produces two effects. First as discussed above, a general defocussing of the reflected sunlight occurs. Consequently, no point in space has the concentration of light equal to that occurring at the focus 54 for rays parallel to the axis 60.

Additionally, the concentrated area of light that does result falls on one side or the other of the focal point 54. Thus, in FIG. 6, if the incident light's path approaches from the left of the axis 60, the highest concentration of reflected light will occur to the right of the focal point 54 and vice versa. While this relocation of the most intense area of radiation may seem a detriment, it may also serve to reorient the axis 60 directly towards the sun.

As shown in FIG. 4, the collector includes the two turbular furnaces 65 and 66 located on either side of the parabola's focal point 54. When the incident sunlight arrives from the left in FIGS. 2, 4, and 5, the furnace 65 on the right side receives more radiation than the furnace 66 on the left.

The right furnace 65 contains an expandable fluid along with the pressure line 67 and the end of the cylinder 68 with which it remains in fluid communication. As the right furnace 65 heats up and the fluid inside expands, its internal pressure increases. This pressure travels along the pressure line 67 to the cylinder 68 and forces out from it the piston 70, anchored at the point 71. The extension of the piston 70 from the cylinder 68 forces the reflector 26 and the transducers 29 and 30 to rotate about the pivotal attachments 15 and 16 to the left, or counterclockwise. This rotation reorients the collector until it points almost directly at the sun, achieving a higher focus of the sun's rays. It also places the concentrated light fully upon the transducers 29 and 30.

Similarly, if the incident light approaches from the right on sheet 2 of the drawings, then the reflector 26 converges them, albeit to a limited extent, near the furnace 66. Fluid in the furnace 66, the pressure line 73 and the cylinder 74 expands and forces out the piston 75. The resulting reorientation rotates the reflector 26 and the transducers 29 and 30 toward the direction of the sun, as desired.

The right half of the orienting device appears more clearly in FIG. 7. The figure shows the furnace 65, shaped to conform to the IR. transducer 30, in fluid communication with the pressure line 67 which similarly couples to the cylinder 68. The piston 70 fits inside the cylinder 68 which allows it longitudinal motion.

The diaphragm 78 attaches to the exterior edge 79. It serves to prevent the escape of the fluid within the cylinder 68 around the edges of the piston 70. of the diaphragm 78 has sufficient expansion to allow the full entrance of the piston 70 into the cylinder 68 without imposing substantial resistance. The membrane may have a composition of high-grade neoprene reinforced with nylon mesh fabric. Alternatively, a bellows may replace the membrane 78 and provide the gas seal. Without a seal, an annual recharging should suffice to replenish the fluid.

The fluid employed in the furnace 65 should have sufficient expandibility to control the piston 70 over its full range of motion. The use of a fluid in the gas phase cushions the motion and limit oscillations of the reflector 26. A liquid with a low boiling point may more readily achieve all of these goals. When the rays strike the furnace 65, the liquid inside boils and goes into the gas phase. The additional gas sufficiently increases the pressure to force the piston 70 out of the cylinder 68 and move the reflector 68. Examples of suitable liquids include Freon 113 ®, Freon 12 ®; and Freon TF ® (fluorocarbons sold by E. I. du Pont de Nemours & Company, Wilmington, Delaware), with the latter providing the more desirable results. A combination of ethylene glycol and water may prove useful over a wide temperature range.

As shown in FIG. 1, the furnaces 65 and 66 need not extend the entire length of the collector 11 to operate effectively. However, it may not contain enough liquid that can convert to gas to control the pistons 70 and 75. Accordingly, FIG. 7 shows a reservoir 80 placed in fluid communication with the furnace 65 by the conduit 81. The reservoir provides the furnace 65 with a constant supply of liquid for evaporation.

The collector of FIG. 8 includes curved, as opposed to straight, cylinders 83 and 84 and pistons 85 and 86. The cylinder 83 and its piston 85 fall on the circumference of a circle having as its center the pivotal point of attachment 15 of the reflector frame 19 to the base 12. The cylinder 84 and its piston 86 similarly fall on the circumference of such an arch. As the frame 19 rotates about the point 15, the angles between the pistons 85 and 86 and the end 87 of the base do not change. Similarly, the angles between cylinder 83 and 84 and the end 34 of the frame 19 do not change. Consequently, the cylinders and the pistons may have fixed points of attachment 88, 89, 90, and 91 to their respective surfaces. This eliminates the need for the hinged connections required for the straight pistons of FIGS. 1, 2, and 7. The latter type can possibly suffer damage from the motion they will undergo over the years.

Moreover, the solar collector can perform with only one piston and cylinder, instead of the two shown above. In this instance a spring would exert a force in the direction that the missing piston and cylinder previously urged the reflector frame 19. The remaining piston and cylinder would overcome the force of the spring to the extent necessary to properly align the collector.

Furthermore, the orienting apparatus shown in the figures can control more than one solar collector. With the collectors coupled together, a single orienting mechanism can properly orient an entire bank of solar collectors.

Figure 10:
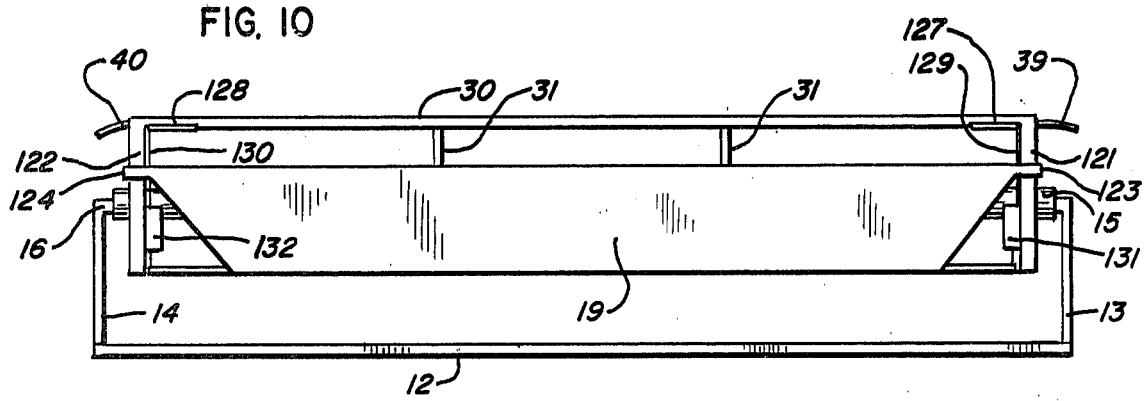
FIG. 10 gives a side view of a solar collector having a second type of safety device.
Figure 11:
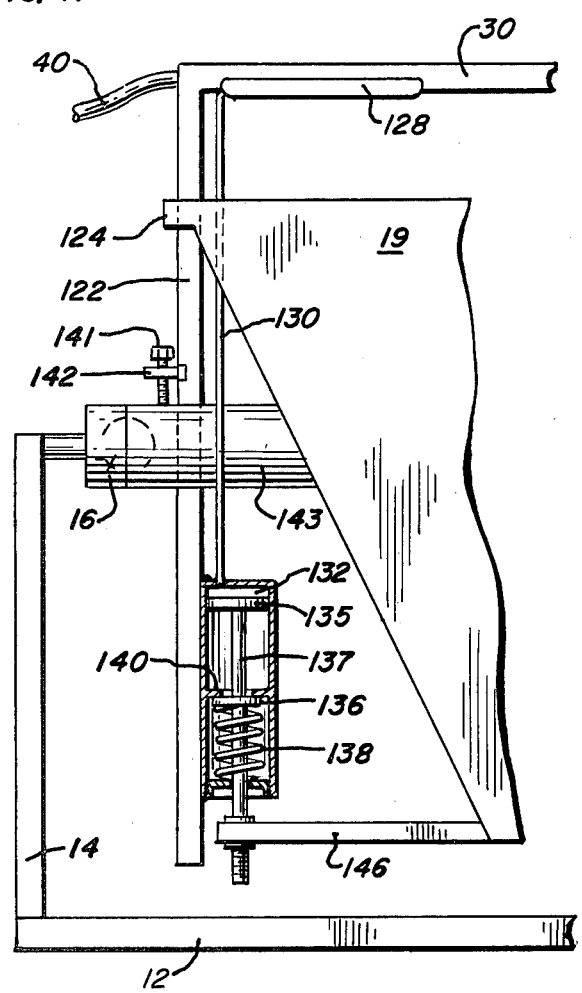
FIG. 11 has an enlarged view of the safety device of FIG. 10 during the normal operation of the collector.
Figure 12:
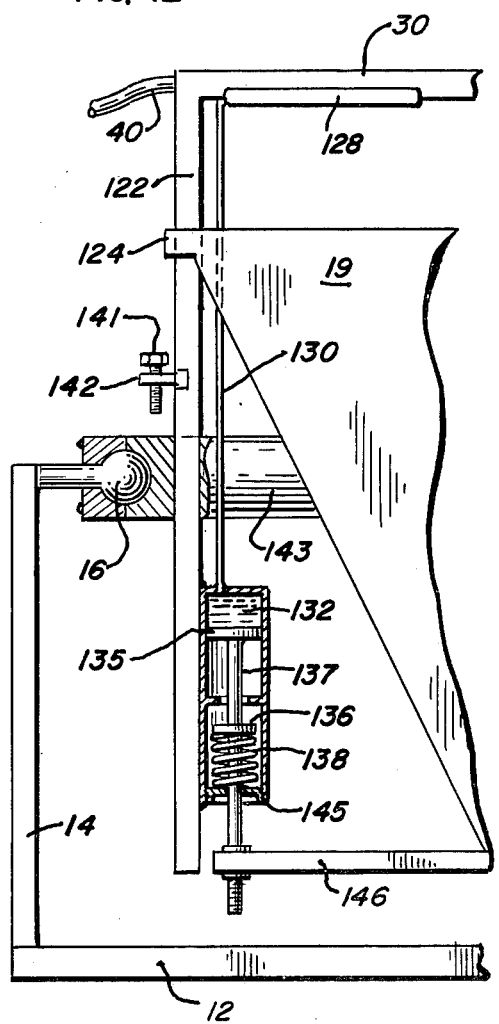
FIG. 12, in an enlarged view, shows the safety device of FIG. 10 when the transducer retains an undesirably large quantity of its radiation energy.

If the fluid within the IR. transducer became stagnant, it could overheat and damage the collector. FIG. 9 shows one device for preventing such damage while FIGS. 10-12 show another device.

If the IR. transducer so overheats, the safety mechanism 94 of FIG. 9 simply disables the orienting mechanism of the collector frame 19. The mechanism 94 includes the auxiliary furnace 95 located very near to the IR. transducer and connected by the fluid line 96 to the narrow cylinder 97. If the furnace 95 receives too much heat from the IR. transducer, the pressure within it increases in the cylinder 97 and pushes against the piston 98. This force counteracts the force of the calibrated spring 99 set to the appropriate tension by the screw 100. The wide piston 104 and the stem 105 connect the narrow piston 98 to the spring 105. As the narrow piston 98 moves to the right, it will force the wide piston 104 in the same direction. Eventually the wide piston 104 will move past, and thus uncover, the opening 107 to the fluid line 108.

However, the fluid line 108 connects to the pressure line 67 between the orienting furnace 65 and its cylinder 68 (of FIG. 7, for example). With the opening 107 uncovered, all the pressure from the furnace 65 may dissipate through the pressure line 67, the fluid line 108, the wide cylinder 109 and the conduit 110 and into the reservoir 111. Simultaneously, an opening similar to the opening 107 but into a separate portion of the wide cylinder 109, sealed off from that shown in FIG. 9, allows the pressure from the remaining furnace 66 to dissipate.

Thus, the overheating of the IR. transducer, operating through the auxiliary furnace 95, has completely disabled the orienting mechanism of the collector frame 19. Consequently, the collector assumes a neutral position and the overheating of the IR. transducer ceases.

Upon the amelioration of the problem with the IR. transducer, the furnace 95 no longer receives sufficient heat to force the narrow piston 97 against the spring 100. As a result, the wide cylinder 104 returns to the left, sealing off the opening 107 to the conduit 108. The oneway check valve 113, however, allows the fluid from the reservoir 111, travelling in the space between the piston 104 and the wide cylinder face 114, to return to the fluid conduit 108 and, from there, to the furnace 65.

The vent 115 relieves any pressure thay may develop on the back of the wide piston 104 as it moves back and forth. Moreover, a mechanism, similar to the diaphragm 78 in FIG. 7, around the narrow piston 98, may prevent the passage of fluid between the narrow and wide cylinders 97 and 109.

The device in FIGS. 10-12 operates by lifting the IR. transducer 30 away from the reflector 26. This change in the transducer's location specifically removes it from the area having the high concentrations of focussed solar rays.

FIG. 10 shows the IR. transducer 30 connected to the two end beams 121 and 122. The end beams, in turn, fit slidably into the sleeves 123 and 124, respectively, attached to the reflector frame 19.

The safety furnaces 127 and 128 lie adjacent to the IR. transducer 30. Any excess of heat transposes readily to the fluid inside the furnaces 127 and 128 which pressurizes the conduits 129 and 130. The cylinders 131 and 132, connected to side beams 121 and 122 of the IR. transducer 30, receive the pressure developed inside the conduits 129 and 130.

When the temperature of the transducer 30 falls to an acceptable range, the apparatus has the configuration shown in greater detail in FIG. 11. There, the pressure within the cylinder 132 does not develop sufficient force against the piston head 135 to move the ring 136, attached to the piston rod 137, against the spring 138. Instead, the cylinder 132 and, thus, the end beam 122 and the IR. transducer 30 rest in their lowest position. There, the ring 136 on the piston rod 137 supports the collar 140 attached to the wall of the cylinder 132. Furthermore, the stop screw 141, sitting in the holder 142 attached to the end beam 122, rests on the support 143 connected to the reflector frame 19. In this position, the IR. transducer 30 receives substantially all of the heat available from the focussed solar radiation.

When the transducer overheats, the fluid in the safety furnace 128 expands and produces the configuration shown in FIG. 12. The pressure travels along the conduit 130 and operates between the position head 135 and the cylinder 132 overcoming the force of the spring 138, which operates against the stop 145. The pressure forces the cylinder 132 to rise. As the cylinder 132 elevates, it moves the end beam 122 and the transducer 30 upwards relative to the support platform 146, to which the piston rod 137 attaches. Since the platform rigidly connects to the reflector frame 19, the transducer 30 has been moved out of the position where it would receive the greatest solar heat. There it may safely rest without overheating until the appropriate repairs enable it to operate properly and return to its normal position shown in FIG. 11.

In FIG. 10, the axis of rotation of the reflector frame 19 derives from a straight line determined by the two pivot points 15 and 16. This axis also passes through the center of area of the reflector 26. As a result, regardless of its direction, any wind reaching the reflector 26 strikes an equal area on either side of the axis of rotation. Consequently, the wind will not tend to turn the reflector 26 in either direction about its axis of rotation. This arrangement obviates the necessity for the orienting mechanism to overcome substantial wind effects.

Accordingly, what is claimed is:

1. A solar collector comprising:
  (a) focusing means, including a reflective concave surface with cylindrical symmetry and, on a cross section perpendicular to an axis of said cylindrical symmetry said reflective surface having the shape of a parabola, for concentrating at a first area at least part of the solar radiation striking a second area;
  (b) transducer means, having a constant orientation relative to said reflective surface and located, at least in part, in proximity to the focal line of said parabola, for receiving concentrated solar radiation at said first area and converting the energy in said concentrated solar radiation to a form usable in a location remote from both said first area and said transducer means;
  (c) support means coupled to said focusing means and said transducer means for holding said focusing means and said transducer means at one of a plurality of different orientations relative to the earth; and
  (d) solar-powered orienting means for increasing the amount of solar radiation reflected by said focusing means onto said first area, said orienting means including:
    (1) collector means coupled to said focusing means for receiving solar radiation reflected from said focusing means when, at any particular time, said transducer means receives substantially less than the maximum amount of solar radiation obtainable from said focusing means, said collector means including two portions, the first of said portions being located on one side of the axial plane of said cylindrically symmetric parabola and the second of said portions being located on the other side of said axial plane; and
    (2) converting means coupled to said support means, said collector means, and said focusing means for changing the orientation of either said focusing means or said transducer means relative to the earth in a direction to increase the amount of solar radiation received from said focusing means by said transducer means, the energy required for changing said orientation being provided from the solar radiation received by said collector means, said first or second portions of said collector means, when receiving greater solar radiation than the other, energizing said converting means to change the orientation of said focusing and said transducer means in a direction to equalize the solar radiation striking said first and second portions.

2. The solar collector of claim 1 wherein said first and second portions of said collector means include a first and second furnace, respectively, having an expandable fluid therein, and said converting means includes (a) first and second cylinders in fluid communication with, respectively, said first and second cylinders, and (b) first and second pistons inserted, in a slidable, substantially fluid-tight manner, in said first and second cylinders, respectively, said first cylinder and piston and said second cylinder and piston being coupled between said focusing means and said support means in a manner such that when a greater amount of solar radiation strikes one of said first and second furnaces than the other, the piston inserted in the particular cylinder coupled to said one furnace will move partially out of said particular cylinder and reorient said focusing means in a direction to equalize the radiation striking said first and second furnaces.

3. The solar collector of claim 2 further including stripping means for spatially separating, from the other, the IR. components or the UV. and Vis. components of the solar radiation in said first area.

4. The solar collector of claim 2 wherein said orienting means further includes safety means for, when the temperature of said transducer means exceeds a predetermined level, rendering said converting means incapable of changing the orientation of said focusing means or said transducer means to a position where said transducer means receives the maximum concentration of solar radiation reflected from said focusing means.

5. The solar collector of claim 4 wherein said safety means renders said converting means incapable of changing the orientation of said transducer or said focusing means relative to the earth.

6. The solar collector of claim 4 wherein said safety means substantially alters the constant orientation between said transducer means and said focusing means.

7. The solar collector of claim 2 wherein, when said reflective surface has a total width of w, said reflective surface is the locus of points equidistant between (a) a straight line and (b) a circle tangent to said straight line and of radius $$r=kw/2$$

wherein k is a constant dependent upon the latitude at which said solar collector is to be placed, has a range of values of about 0.611 to 0.825, and has a value of about 0.7425 for about 44° of latitude.

8. The solar collector of claim 7 wherein said reflective surface extends from the point of tangency between said circle and said line and extends on either side of said point of tangency to a lateral point where a line drawn from the center of said circle to said point of tangency forms an angle of about 41° with a line drawn from said center to said lateral point.

9. The solar collector of claim 2 wherein said support means supports said focusing and said transducer means with a pivotal connection, said plurality of different orientations of focusing and said transducer means relative to said earth are acheived from each other by rotations about said pivotal connections, the axis of said rotations being an axis of cylindrical symmetry of said focusing means, and said axis of said rotations being through the center of area of said reflective surface.

10. In a solar collector having:
 (a) focusing means including a reflective concave surface for concentrating at a first area at least part of the solar radiation striking a second area;
 (b) transducer means, coupled to said focusing means with a normally constant orientation relative thereto, for receiving concentrated solar radiation at said first area and converting the energy in said concentrated solar radiation to a form usable in a location remote from both said first area and said transducer means;
 (c) support means coupled to said focusing means and said transducer means for holding said focusing means and said transducer means at one of a plurality of different orientations relative to the earth; and
 (d) orienting means coupled between said support means and said focusing means for when, at any particular time, said transducer means receives substantially less than the maximum amount of solar radiation obtainable from said focusing means, changing the orientation of either said focusing means or said transducing means relative to the earth in a direction to increase the amount of solar radiation received from said focusing means by said transducing means,
the improvement wherein said reflective surface has cylindrical symmetry and, on a cross section perpendicular to an axis of said cylindrical symmetry, the shape of a parabola; (2) said transducer means is located at least in part in proximity to the focal point of said parabola; and (3) when said reflective surface has a total width of w, said reflective surface is the locus of points equidistant between (a) a straight line and (b) a circle tangent to said line and of radius $$r=kw/2$$

wherein k is a constant dependent upon the latitude at which said solar collector is to be placed, has a range of values of about 0.611 to 0.825, and has a value of about 0.7425 for about 44° of latitude.

11. The improvement of claim 10 wherein said reflective surface extends from the point of tangency between said circle and said line and extends on either side of said point of tangency to a lateral point chosen such that a line drawn from the center of said circle to said point of tangency forms an angle of about 41° with a line drawn from said center to said lateral point.

12. In a solar collector having:
 (a) focusing means for concentrating at a first area at least part of the solar radiation striking a second area;
 (b) transducer means for receiving concentrated solar radiation at said first area and converting the energy in said concentrated solar radiation to a form usable in a location remote both from said first area and said transducer means;
 (c) support means coupled to said focusing means and said transducer means for holding said focusing means and said transducer means at one of a plurality of different orientations relative to the earth; and
 (d) orienting means coupled between said support means and said transducer means or said focusing means for, when, at any particular time, said transducer means receives substantially less than the maximum amount of solar radiation obtainable from said focusing means, changing the orientation of either said focusing means or said transducer means relative to the earth in a direction to increase the amount of solar radiation received from said focusing means by said transducer means,
the improvement comprising safety means for, when the temperature of said transducer means exceeds a predetermined level, rendering said orienting means incapable of changing the orientations of said focusing means and said transducer means to positions where said transducer means receives the maximum concentration of solar radiation reflected from said focusing means.

13. The improvement of claim 12 wherein said safety means renders said orienting means incapable of changing the orientation of said transducer or said focusing means relative to the earth.

14. The improvement of claim 13 wherein said safety means alters the orientation of said transducer means and said focusing means relative to each other in a direction to avoid said transducer means from occupying a position of maximum concentration of the solar radiation concentrated by said focusing means.

15. In a solar collector having:
 (a) focusing means for concentrating at a first area at least part of the solar radiation striking a second area;
 (b) transducer means for receiving concentrated solar radiation at said first area and converting the energy in said concentrated solar radiation to a form usable in a location remote from both said first area and said transducer means;

(c) support means coupled to said focusing means and said transducer means for holding said focusing means and said transducer means at one of a plurality of different orientations relative to the earth; and (d) orienting means coupled between said support means and said focusing means for, when, at any particular time, said transducer means receives substantially less than the maximum amount of solar radiation obtainable from said focusing means, changing the orientation of either said focusing means or said transducing means relative to the earth in a direction to increase the amount of solar radiation received from said focusing means by said transducing means, the improvement comprising stripping means coupled to said focusing means for spatially separating from the other the IR. components or the UV. and Vis. components of the solar radiation in said first area and providing a maximum concentration of IR. solar radiation at a first location and a maximum concentration of UV. and Vis. solar radiation at a second location spatially removed from said first location.

16. The improvement of claim 15 wherein said stripping means forms part of said transducer means and absorbs a majority of the IR. solar radiation striking it while reflecting or transmitting substantially all of the UV. and Vis. solar radiation striking it.

* * * * *